United States Patent [19]

Steppan et al.

[11] Patent Number: 4,776,892

[45] Date of Patent: Oct. 11, 1988

[54] PROCESS FOR STRIPPING LIGHT-HARDENED PHOTORESIST LAYERS

[75] Inventors: Hartmut Steppan, Wiesbaden; Ulrich Geissler, Hochheim, both of Fed. Rep. of Germany

[73] Assignee: Hoechst Aktiengesellschaft, Fed. Rep. of Germany

[21] Appl. No.: 899,993

[22] Filed: Aug. 22, 1986

[30] Foreign Application Priority Data

Aug. 24, 1985 [DE] Fed. Rep. of Germany ....... 3530282

[51] Int. Cl.$^4$ .................. B08B 7/00; B08B 30/00; C03C 23/00; G03C 5/00
[52] U.S. Cl. ........................................ 134/38; 134/2; 134/29; 430/329; 430/331; 252/547; 252/156; 252/DIG. 8
[58] Field of Search ................. 252/547, 156, DIG. 8; 134/2, 29, 38; 430/331, 329

[56] References Cited

U.S. PATENT DOCUMENTS

| | | | |
|---|---|---|---|
| 3,673,099 | 6/1972 | Corby et al. ...................... | 252/156 |
| 4,078,102 | 3/1978 | Bendz et al. ...................... | 427/341 |
| 4,089,704 | 5/1978 | Heiss, Jr. et al. ................. | 134/29 |
| 4,202,703 | 5/1980 | Zuber et al. ...................... | 134/2 |
| 4,239,661 | 12/1980 | Muraoka et al. .................. | 252/541 |
| 4,518,675 | 5/1985 | Kataoko ............................ | 134/38 X |
| 4,556,629 | 12/1985 | Paulin et al. ..................... | 252/547 X |
| 4,610,953 | 9/1986 | Hashimoto ....................... | 252/547 X |
| 4,628,023 | 12/1986 | Cawston et al. ................. | 252/547 X |

FOREIGN PATENT DOCUMENTS

| | | | |
|---|---|---|---|
| 716032 | 8/1965 | Canada ................................ | 252/156 |
| 0097282 | 6/1982 | European Pat. Off. ............ | 430/331 |
| 1802921 | 4/1970 | Fed. Rep. of Germany ...... | 252/156 |

OTHER PUBLICATIONS

Patent Abstracts of Japan, vol. 5, No. 91 (E-61) [763], Jun. 13, 1981.

*Primary Examiner*—Helen M. S. Sneed
*Assistant Examiner*—William G. Wright
*Attorney, Agent, or Firm*—Foley & Lardner, Schwartz, Jeffery, Schwaab, Mack, Blumenthal & Evans

[57] ABSTRACT

Light-hardened photoresist layers are stripped by treating the layer with an aqueous solution of an organic quaternary ammonium base and, optionally a strong inorganic base. The resulting layer residues are dispersed as relatively small flakes which do not become lodged between conducting paths.

10 Claims, No Drawings

PROCESS FOR STRIPPING LIGHT-HARDENED PHOTORESIST LAYERS

BACKGROUND OF THE INVENTION

The present invention relates to a process for stripping light-hardened photoresist layers.

In the photoresist process, the steps of exposing and washing out the photoresist layer create an image stencil which shields underlying surface areas against etching or electroplating baths. When metal removal or deposition has ended, the photoresist stencil is customarily removed, in some cases by being peeling off mechanically, but more frequently by treatment with a sufficiently active chemical solution. This removal of the layer is referred to generally in the art as "stripping." The stripping solutions used for this purpose are typically solutions of strong bases, for example, an aqueous potassium hydroxide solution. Organic solvents are also frequently employed, usually with quaternary ammonium bases.

Different solutions which have been employed in removing various types of materials, including photoresist, are disclosed by the following documents:

(1) U.S. Pat. No. 4,089,704 describes the removal of a silicone rubber coating with a solution of tetramethylammonium hydroxide in methanol and isopropanol.

(2) U.S. Pat. No. 4,239,661 describes a cleaning solution for removing contamination, including fingerprints and positive photoresist residues, which comprises an aqueous solution of trialkylhydroxyalkylammonium hydroxide, a complexing agent and a nonionic wetting agent.

(3) U.S. Pat. No. 4,078,102 describes a stripping solution for negative- and positive-working photoresists that comprises an alkali metal, an alkaline earth metal or an ammonium hydroxide dissolved in an alcohol mixed with a carbonyl compound.

(4) U.S. Pat. No. 3,673,099 teaches that hardened resins, for example, of silicones or polyvinyl cinnamate, can be removed by means of a mixture of a strong base, for example a quaternary ammonium hydroxide, and N-methylpyrrolidone.

(5) U.S. Pat. No. 4,202,703 describes the stripping of a negative photoresist with a solution of tetramethylammonium hydroxide and a wetting agent in a lower alcohol, followed by dipping in trichloroethane.

In general, positive photoresist stencils are significantly easier to remove than negative resists. Since a positive resist comprises the unchanged, unexposed areas of the photoresist layer, it normally redissolves even in the coating solvent. By contrast, light-cured negative resists are substantially crosslinked as a result of exposure, so they are substantially insoluble in most solvents. Their stripping generally requires chemical agents that are very active. In addition, negative resists dissolve only incompletely, if at all, in stripper solutions, and instead form flocks of varying size which become deposited as a sediment. Depending on their size, these flocks can interfere considerably with the handling of the solution, particularly in automatic processing equipment.

SUMMARY OF THE INVENTION

It is therefore an object of the present invention to provide a process for stripping light-hardened photoresist layers which results in reduced flock size.

It is also an object of the present invention to provide for the removal of light-hardened photoresist layers without organic solvents.

In accomplishing the foregoing objects, there has been provided, in accordance with one aspect of the presently claimed invention, a process for stripping a light-hardened photoresist layer, comprising the step of treating at least a part of the layer with an aqueous solution comprising an organic quaternary ammonium base, whereby the treated part of the layer is removed by the aqueous solution. In a preferred embodiment, a strong inorganic base is added to the solution.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The ammonium bases used in accordance with the present invention are preferably aliphatic quaternary ammonium hydroxides, in paricular tetraalkylammonium hydroxides. Among these, the compounds containing alkyl groups having 1 to 8, particularly 1 to 4, carbon atoms are preferred. One or more of such alkyl groups can be substituted by hydroxyl groups. It is also possible for some of the alkyl groups to be replaced by alkenyl groups.

An aqueous solution within the present invention can contain about 0.05 to 2 mole/l, preferably 0.1 to 1 mole/l, of a quaternary ammonium base. The inorganic bases used are preferably alkali metal hydroxides, the concentration of which can likewise range between about 0.05 and 2, especially 0.1 and 1, mole/l.

Stripping according to the present invention is generally carried out at an elevated temperature, preferably between about 30° and 70° C. The time for the stripping varies, as a function of the temperature and concentration of the solution, between about 30 seconds and 5 minutes.

The process of the present invention is typically carried out with negative-working (light-hardenable) resist layers. Exemplary of suitable light-hardened layers are those based on polyvinyl cinnamate, cyclized rubber, organic azides, chalcones and allyl-containing polymers. The process of the present invention can be practiced to particular advantage with photopolymerizable materials. When used in a recording layer, these materials contain a polymerizable compound with at least two terminal, ethylenically unsaturated double bonds, a polymeric binder and a photoinitiator which, on exposure to actinic radiation, is capable of initiating free-radical polymerization of the ethylenically unsaturated compound.

Other constituents which can be present in the layer are stabilizers add inhibitors for preventing dark polymerization of the monomers, hydrogen donors, wetting agents, plasticizers, sensitometric regulators, dyes and colorless or colored pigments.

Photopolymerizable monomers that are suitable for purposes of the present invention are known and described, for example, in U.S. Pat. Nos. 2,760,863 and 3,060,023. Preferred examples are acrylic and methacrylic acid esters, such as polyethylene glycol dimethacrylate; acrylates and methacrylates of trimethylolethane, trimethylolpropane and pentaerythritol; and acrylates and methacrylates of polyhydric alicyclic alcohols. It is also advantageous to use reaction products of diisocyanates with partial esters of polyfunctional alcohols. Such monomers are described in German Offenleggungsschriften No. 2,064,079 and No. 2,361,041.

The binders used are preferably those which are soluble, or at least swellable, in aqueous alkaline solutions. Illustrative examples of these are maleate resins and polymers of β-methacryloyloxyethyl N-(p-tolylsulfonyl)-carbamate, and copolymers of these and similar monomers with other monomers. Styrene/maleic anhydride copolymers are also suitable. Methyl methacrylate/methacrylic acid copolymers and copolymers of methacrylic acid, alkyl methacrylates and methyl methacrylates and/or styrene, acrylonitrile and the like, as described in German Offenleggungsschriften No. 2,064,080 and No. 2,363,806, are preferred.

The following examples illustrate the advantages of the process of the present invention. Unless otherwise stated, percentages and mixing ratios are by weight. Parts by weight (pbw) relate to parts by volume (pbv) as the g relates to the cm$^3$.

To test strippability, two different 38 μm-thick dry resist layers having the composition given below were applied to 25 μm-thick polyethylene terephthalate films, which were thereafter covered with 20 μm-thick polyethylene films. In a commercially available dry resist laminator, the cover films of polyethylene were peeled off and the resist layers were laminated by means of pressure and heat onto circuit boards which comprised insulating boards with a 35 μm-thick copper coat. The dry resist layers had the following composition:

Resist layer 1

- 6.5 pbw of a terpolymer of n-hexyl methacrylate, methacrylic acid and styrene (60:35:5), a polymerizable urethane prepared by
b 8.8 pbw of a polymerizable urethane prepared by reacting 1 mole of triethylene glycol, 2 moles of 2,2,4-trimethylhexamethylene diisocyanate and 2 moles of hydroxyethyl methacrylate,
0.25 pbw of 9-phenylacridine and 0.025 pbw of a blue azo dye obtained by coupling 2,4-dinitro-6-chlorobenzenediazonium salt with 2-methoxy-5-acetylamino-N,N-diethyl aniline.

Resist layer 2

6.5 pbw of a terpolymer of n-hexyl methacrylate, methacrylic acid and styrene (60:30:10),
5.6 pbw of a polymerizable urethane obtained by reacting 1 mole of 2,2,4-trimethylhexamethylene diisocyanate and 2 moles of hydroxyethyl methacrylate,
0.15 pbw of triethylene glycol dimethacrylate,
0.2 pbw of 9-phenylacridine,
0.015 pbw of Michler's ketone and
0.06 pbw of the blue azo dye of resist layer 1.

The coated circuit boards were exposed under a master and developed in a spray developer with 1% strength sodium carbonate solution. The master used was a circuit pattern which, in addition to lines and circular areas of varying width or size, contained a wide transparent strip over the entire image length to permit an assessment of effectiveness, particularly in the case of hardened layer regions presenting a large surface area. To strip the developed boards, 200 ml of stripper solution were introduced into a 200 ml-capacity beaker with a 6-cm diameter, and were heated to 50° C. The solution was then stirred with a magnetic stirrer, and one of the developed boards was dipped into it. Initiation and termination of layer removal were noted.

The solution was stirred for a total of 15 minutes, and the resulting flakes were classified by size after settling out. The flakes were graded on a scale of from 0 to 6 for the largest flakes, 0 denoting the smallest area and 6 the largest. When the largest flakes in an experiment were smaller than 1 mm$^2$, the size was designated 0; in the case of maximum flake sizes of 0.5 cm$^2$ or slightly higher, the value 6 was assigned.

The results of the above-described procedures are set out in the table below:

| Resist layer | Solution | Start of stripping (sec.) | End of stripping (sec.) | Flake size |
|---|---|---|---|---|
| 1 | 2.8% of KOH (0.5 mol/l) | 70 | 90 | 5 |
| 1 | 5.6% of KOH (1 mol/l) | 50 | 60 | 6 |
| 2 | 2.8% of KOH (0.5 mol/l) | 80 | 130 | 3 |
| 2 | 5.6% of KOH (1 mol/l) | 60 | 80 | 4 |
| 1 | 9.1% of TMAH.5H$_2$O (0.5 mol/l) | 40 | 145 | 1 |
| 1 | 18.1% of TMAH.5H$_2$O (1 mol/l) | 40 | 55 | 2-3 |
| 1 | 9.1% of TMAH.5H$_2$O + 0.5% of KOH | 55 | 85 | 2 |
| | 9.1% of TMAH.5H$_2$O + 1% of KOH | 50 | 65 | 2-3 |
| | 9.1% of TMAH.5H$_2$O + 2% of KOH | 45 | 55 | 3 |
| 1 | 4.5% of TMAH.5H$_2$O + 0.5% of KOH | 65 | 160 | 2-3 |
| | 4.5% of TMAH.5H$_2$O + 1% of KOH | 60 | 100 | 2-3 |
| | 4.5% of TMAH.5H$_2$O + 2% of KOH | 50 | 70 | 3 |
| 1 | 2.3% of TMAH.5H$_2$O + 1% of KOH | 80 | 155 | 2 |
| | 2.3% of TMAH.5H$_2$O + 2% of KOH | 60 | 85 | 3 |
| 1 | 1.1% of TMAH.5H$_2$O + 1% of KOH | 110 | 230 | 2 |
| | 1.1% of TMAH.5H$_2$O + 2% of KOH | 75 | 105 | 2-3 |
| | 1.1% of TMAH.5H$_2$O + 3% of KOH | 55 | 80 | 2-3 |
| | 1.1% of TMAH.5H$_2$O + 4% of KOH | 55 | 75 | 3 |
| 1 | 0.6% of TMAH.5H$_2$O + 2% of KOH | 100 | 140 | 3-4 |
| 1 | 0.3% of TMAH.5H$_2$O + 2% of KOH | 100 | 140 | 3-4 |
| 2 | 9.1% of TMAH.5H$_2$O + | 70 | 215 | 0 |
| 2 | 18.1% of TMAH.5H$_2$O | 45 | 95 | 0-1 |
| 2 | 9.1% of TMAH.5H$_2$O + 0.5% of KOH | 60 | 130 | 0-1 |
| | 9.1% of TMAH.5H$_2$O + 1% of KOH | 50 | 100 | 0-1 |
| | 9.1% of TMAH.5H$_2$O + 2% of KOH | 40 | 75 | 0-1 |

TMAH = Tetramethylammonium hydroxide

Similar results were obtained with aqueous solutions of other alkylammonium hydroxides, for example, tetraethylammonium hydroxide (TEAH), trimethyl (2-hydroxyethyl)-ammonium hydroxide (choline) and diallyldimethylammonium hydroxide (DADMAH):

| Resist layer | Solution | Start of stripping (sec.) | End | Flake size |
|---|---|---|---|---|
| 1 | 14.7% of TEAH (1 mol/l) | 65 | 110 | 2 |
| 1 | 12.1% of choline (1 mol/l) | 50 | 80 | 2 |
| 1 | 14.3% of DADMAH (1 mol/l) | 60 | 100 | 2 |

Electroplated boards can only be stripped satisfactorily if the flake size of the resist is between 0 and 3. If larger flakes are formed, they get caught, particularly in narrow channels between conducting paths, which leads to flaws in the subsequent etch.

What is claimed is:

1. A process for stripping a light-hardened photoresist layer, comprising the step of treating at least a portion of said layer with an aqueous solution comprising an organic quaternary ammonium base, whereby said portion is removed by said solution.

2. The process as claimed in claim 1, wherein said aqueous solution further comprises a strong inorganic base.

3. The process as claimed in claim 1, wherein said photoresist layer is a photopolymerizable layer.

4. The process as claimed in claim 3, wherein said photopolymerizable layer contains a waterinsoluble polymeric binder which is soluble or at least swellable in aqueous alkaline solutions.

5. The process as claimed in claim 1, wherein said quaternary ammonium base comprises a tetraalkylammonium hydroxide comprised of alkyl groups having 1 to 8 carbon atoms.

6. The process as claimed in claim 5, wherein at least one of said alkyl groups is substituted by a hydroxyl group.

7. The process as claimed in claim 1, wherein said quaternary ammonium base comprises a nitrogen atom carrying alkyl and alkenyl groups as substituents.

8. The process as claimed in claim 1, wherein said aqueous solution contains 0.05 to 2 mole/l of quaternary ammonium base.

9. The process as claimed in claim 2, wherein said aqueous solution contains 0.05 to 2 mole/l of an alkali metal hydroxide.

10. The process as claimed in claim 1, wherein said aqueous solution is free of organic solvent.

* * * * *